United States Patent
Coteus et al.

(10) Patent No.: US 7,863,089 B2
(45) Date of Patent: Jan. 4, 2011

(54) PLANAR ARRAY CONTACT MEMORY CARDS

(75) Inventors: Paul Coteus, Yorktown, NY (US); Kevin C. Gower, LaGrangeville, NY (US); Shawn Anthony Hall, Pleasantville, NY (US); Gareth Geoffrey Hougham, Ossining, NY (US); Dale J. Pearson, Bedford Hills, NY (US)

(73) Assignee: International Business Machines Corporation, Armonk, NY (US)

( * ) Notice: Subject to any disclaimer, the term of this patent is extended or adjusted under 35 U.S.C. 154(b) by 593 days.

(21) Appl. No.: 11/855,325

(22) Filed: Sep. 14, 2007

(65) Prior Publication Data

US 2008/0045052 A1    Feb. 21, 2008

Related U.S. Application Data

(62) Division of application No. 11/146,495, filed on Jun. 6, 2005, now Pat. No. 7,282,790.

(51) Int. Cl.
*H01L 21/44* (2006.01)
*H01L 21/48* (2006.01)
*H01L 21/50* (2006.01)
*H01L 21/82* (2006.01)

(52) U.S. Cl. .................................. 438/106; 438/128
(58) Field of Classification Search ......... 438/106–109, 438/121–128, E23.051, E23.067, E23.068
See application file for complete search history.

(56) References Cited

U.S. PATENT DOCUMENTS

| 7,061,784 B2 | 6/2006 | Jakobs et al. ............. 365/51 |
| 7,212,408 B2 | 5/2007 | Noble ...................... 361/719 |
| 2006/0095629 A1 | 5/2006 | Gower et al. ............ 710/305 |

FOREIGN PATENT DOCUMENTS

| JP | 11-67365 | 7/1989 |
| JP | 2004-79377 | 3/2004 |
| WO | WO 2004/015822 A1 | 2/2004 |

*Primary Examiner*—Cuong Q Nguyen
(74) *Attorney, Agent, or Firm*—Harrington & Smith

(57) ABSTRACT

A Planar Memory Module (PAMM) device comprising a generally planar card comprising a first side and a second side, the first side having a plurality of couplings and the second side having a plurality of connectors, a plurality of memory devices coupled to the card via a first portion of the plurality of couplings, and at least one hub chip coupled to the card via a second portion of the plurality of couplings. Each of the plurality of couplings is connected to an associated one of the plurality of connectors.

19 Claims, 6 Drawing Sheets

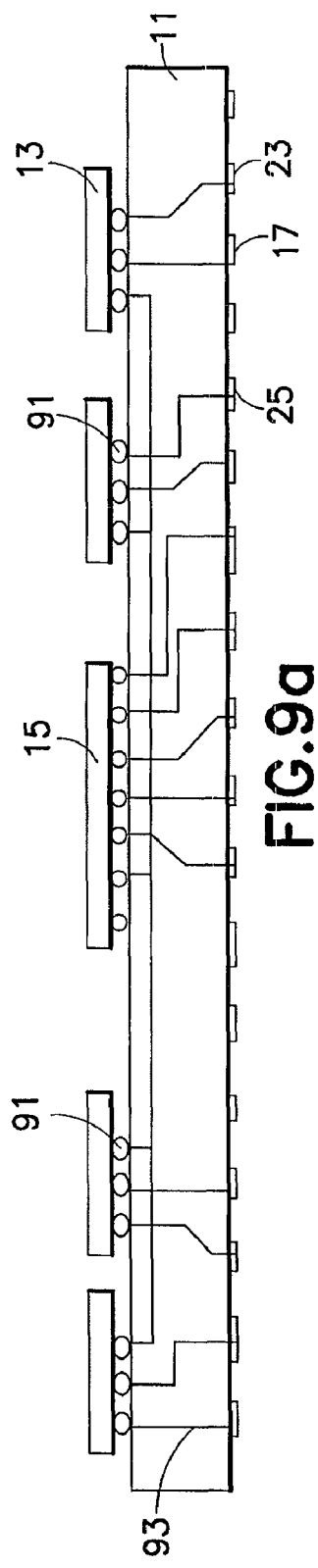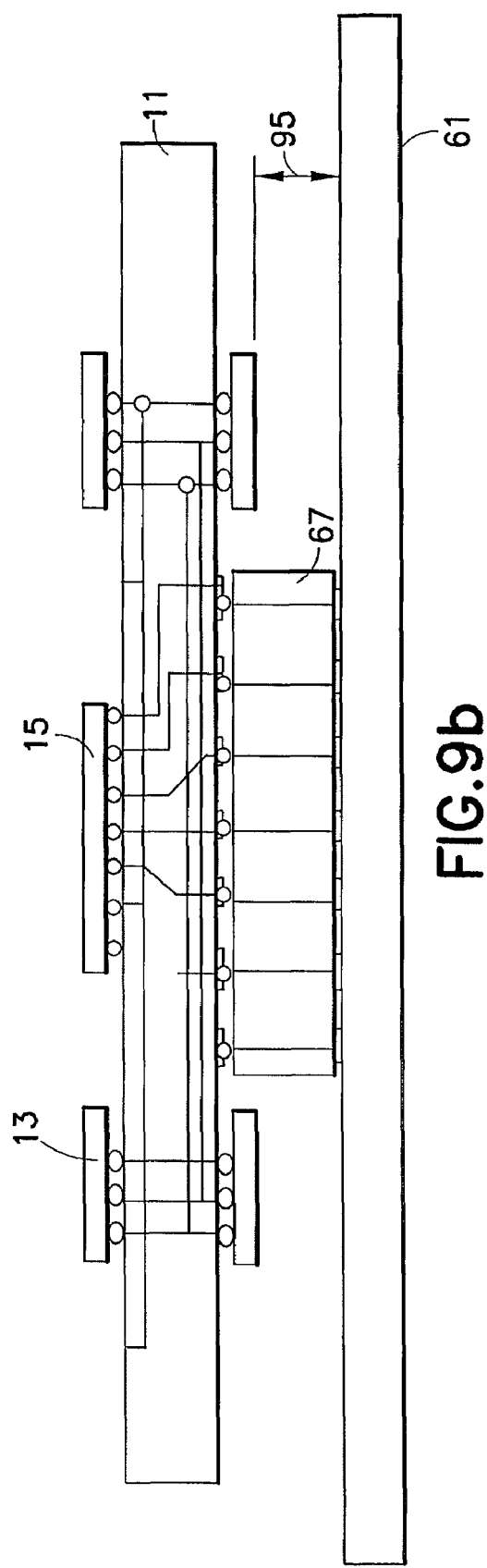

PLANAR ARRAY CONTACT MEMORY CARDS

CROSS REFERENCE TO RELATED APPLICATIONS

This application is a Divisional of and claims the benefit of U.S. patent application Ser. No. 11/146,495 filed on Jun. 6, 2005 now U.S. Pat. No. 7,282,790, and is related to U.S. patent application Ser. No. 11/855,356, filed on even date herewith.

This Invention was made with Government support under prime contract H98230-04-C-0920 awarded by the Maryland Procurement Office (MPO). The Government has certain rights in this invention.

FIELD OF THE INVENTION

This invention relates generally to a system for packaging memory devices for electronic computer systems.

BACKGROUND OF THE INVENTION

Electronic computing machines make common use of dual inline memory modules (DIMMs). In particular, memory DIMMs which adhere to an industry standard, or which are customized, are widely used to provide memory capability to electronic computing devices. In a common configuration, a DIMM is a circuit card incorporating multiple dynamic random-access memory (DRAM) devices and, optionally, circuitry for clock, address, and control distribution, as well as possible data re-buffering, error correction, and serialization. Typically, each DIMM is attached to a system planar via a memory connector. As used herein, "system planar" refers to any and all generally planar system components of an electronic computing device capable of sending and receiving digital data.

Unfortunately, such a configuration is not optimal in situations which require high-speed memory operations between the circuitry of the system planar and the memory and other circuitry on the DIMM. In the particular case of high-speed memory access, all clock, address, and control data, as well as data passed to and from the DIMM, must pass through the memory connector. The memory connector is physically large, limited in the number of connector pins contained thereupon, and is usually attached to the system planar through pins either soldered or press-fit. As the physical size of DRAMs continues to decrease, the memory connector increasingly functions as a bottleneck slowing the movement of data between the electronic computing device and the DIMM.

In addition to the diminution in the speed of data transfer, the presence of the connector creates additional problems. The connector pins are physically large and result in relatively large holes in the planar that can block wiring channels. Soldering the connector pins is an environmental hazard, and can also cause deflection of the DIMM making the attachment of other components difficult. Connectors cannot be easily placed back-to-back, on opposite sides of a circuit board, as the connector pins occupy nearly all the space between adjacent connectors. In addition, each connector is an impedance discontinuity to high-speed signaling and often requires that a ground return be placed immediately adjacent to the connector in order to reduce undesired reflections and cross talk to other signal lines.

Connectors suitable for packaging of dense electronics, such as those in so called "blade" servers and laptop computers typically place the DIMM at right angles to the system planar. A DIMM that is situated at a right angle to the system planar is prone to becoming dislodged from the connector, especially during shipping. While the incidence of dislodgement can be ameliorated through the use of latching mechanisms, such mechanisms tend to block airflow and add cost to the design. Furthermore, DIMM connectors can be unreliable as they are "single-wipe", metal-on-metal contacts and thus are subject to corrosive failures.

Meanwhile, the other end of a DIMM memory net is typically either an independent memory controller or a memory controller integrated into a computer processor chip. The processor chip is often mounted on a relatively low-cost plastic first-level package. Such plastic packages take the densely spaced signal and power connections of the processor or controller and "fan-out" to a coarser array of contacts. The packaged processor chip is often then connected in turn to a circuit board through an array connector; an example of which might be a low-cost, reliable, land-grid-array connector although any array based (co-planar) connector will suffice.

Attempts to improve the DIMM form factor have focused primarily on the benefits of miniaturization. However, smaller DIMMs tend to cause a myriad of alignment and reliability problems. Alternatively, slanting the DIMM towards the system planar tends to degrade electrical performance. While surface mount techniques might appear to be useful, surface mount DIMM connectors are difficult to solder given it's long and narrow aspect ratio.

What is needed is a device for coupling integrated circuits, such as memory devices, to a system planar that does not exhibit the shortcomings known in the art.

SUMMARY OF THE INVENTION

In accordance with an embodiment of the invention, a memory module comprises a generally planar card comprising a first side and a second side, said first side comprising a plurality of couplings and said second side comprising a plurality of connectors, a plurality of memory devices coupled to said card via a first portion of said plurality of couplings, and at least one hub chip coupled to said card via a second portion of said plurality of couplings wherein individual ones of said plurality of couplings are connected to other ones of said plurality of couplings and other ones of said plurality of connectors via a plurality of internal connectors.

In accordance with a further embodiment of the invention, a method comprises providing a generally planar card comprising a first side and a second side, the first side comprising a plurality of couplings and the second side comprising a plurality of connectors; coupling a plurality of memory devices attached to the first side of the card to at least one memory hub also attached to the first side of the card via a first portion of the plurality of couplings, and coupling at least one hub chip via a second portion of the plurality of couplings to an associated plurality of connectors on the second side of the card.

In accordance with another embodiment of the invention, an apparatus comprises a system planar and a card coupled to the system planar. The card comprises a first side and a second side, where the first side comprises a plurality of couplings and the second side comprises a plurality of connectors. There are a plurality of memory devices coupled to the card via a first portion of the plurality of couplings, and at least one hub chip coupled to the card via a second portion of the plurality of couplings.

BRIEF DESCRIPTION OF THE DRAWINGS

FIG. 9a is a cross section illustration of a PAMM.

FIG. 9b is a cross-section illustration of a PAMM wherein DRAMs are attached to two sides of the PAMM.

DETAILED DESCRIPTION OF THE INVENTION

In an embodiment of the invention, a planar memory module (PAMM) is provided. Each PAMM is formed from a generally planar card coupled via a first surface to at least one memory device and is capable of being coupled via a second side to the system planar. The PAMM card may be coupled to the system planar via an array connector such as a land grid array (LGA) interposer, an FCI Connect Megarray, and Intel pingrid array. As a result, co-planar array connector technology and laminate first level package technology, such as that used for processors, is combined to address the particular requirements of memory utilization for electronic computing devices.

Figure 1A:
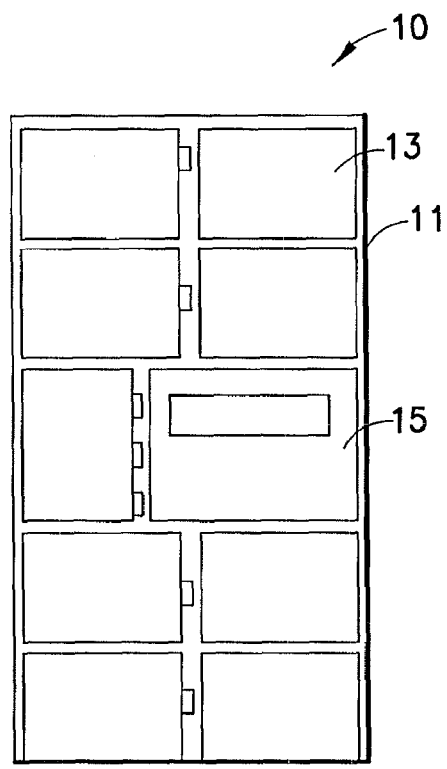
FIG. 1a is an illustration of an embodiment of a top side of the Planar Memory Module (PAMM) of the invention.
Figure 1B:
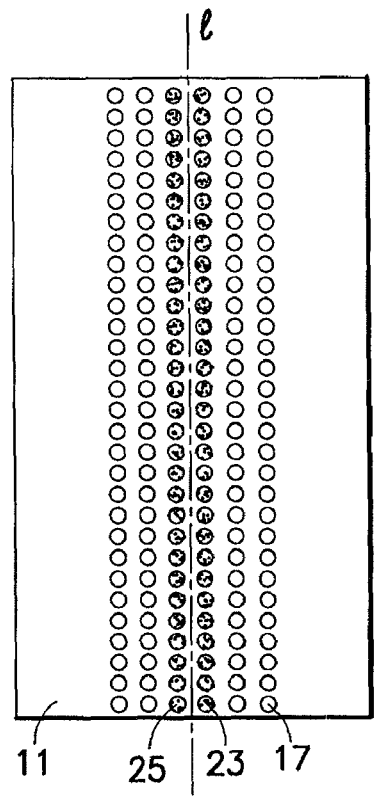
FIG. 1b is an illustration of an embodiment of a bottom side of the PAMM of the invention.

With reference to FIGS. 1a and 1b, there is illustrated a PAMM 10 and opposing sides of an embodiment of a PAMM card 11 coupled to multiple memory devices 13 and a single hub chip 15. Hub chip 15 operates to synchronize and control the flow of digital data amongst the multiple memory devices 13 and between the PAMM 10 and the system planar. The hub chip can provide a variety of functions. Some functions which have already become standard in the industry, or poised to become high-volume standards are as follow. First, the hub chip 15 distributes clock signals and re-buffers the address and control functions to the DRAMs so that the memory controller need only control the state of the hub chip inputs, while the hub chips 15 output then change the state of the DRAM clock, address, and control inputs. Alternatively, the hub chip 15 can re-buffer the data thereby completing the standard for the JEDEC "fully buffered DIMM", or FBDIMM. In such a case the hub chip 15 serializes the data stream to and from the DRAM, and communicates to the memory controller at a faster speed, through fewer signals, than the DRAM bus. Other hub-chip functions include performing high-level functions normally found in a memory controller.

FIG. 1a shows a top side of the PAMM card 11. As used herein, "top" refers to a side of the PAMM card which faces away from the system planar when the PAMM 10 is secured to the system planar. Conversely, the "bottom" side of PAMM card illustrated in FIG. 1b refers to the side of the PAMM card that is mounted facing the system planar. PAMM 10 is shown in exemplary fashion with nine memory devices 13, preferably DRAM chips, and a single hub chip 15 coupled to the top side of PAMM card 11. Fewer or more DRAMs can be accommodated. The bottom side of PAMM card 11 is illustrated with an exemplary number of one hundred and ninety-two connectors 17, 23, 25. Each connector 17, 23, 25 is an electrically conductive structure, including, but not limited to, a pin or a tab, capable of coupling with an associated structure on the system planar. Such a coupling may be accomplished through direct contact (e.g. direct soldered), or preferably, as described below, via a co-planar array connector. Examples of array connectors include, but are not limited to, an LGA interposer with retention, and a two-piece separable array connector of which several examples are known in the art.

Figure 2A:
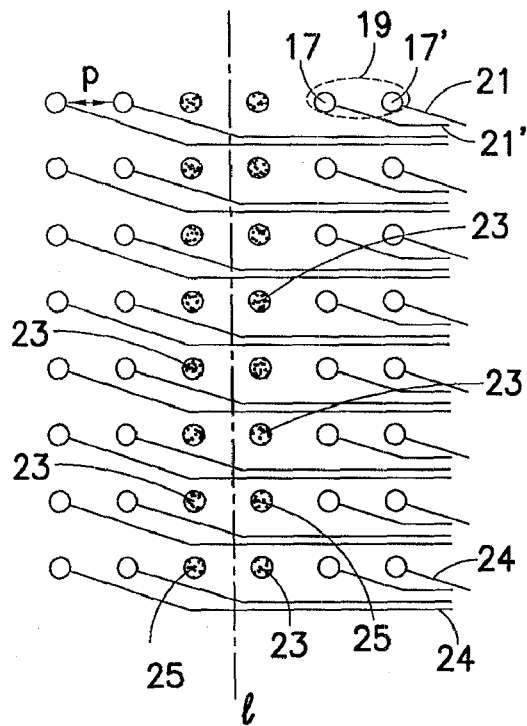
FIG. 2a is a schematic diagram of the system planar wiring for an embodiment of a PAMM.

With reference to FIG. 2a, there is illustrated in schematic fashion an embodiment of a portion of the system-planar wiring 24 on the system planar (not shown) overlaid on the connectors 17, 23, 25 arranged on the bottom side of the PAMM card 11. Each connector is either a signal connector 17, a power connector 25, or a ground connector 23. Power connectors include, but are not limited to, voltage pins supplying different voltages, and pins supplying a reference voltage as opposed to sourcing current. A signal connector 17 may be coupled to a single wire of the system planar wiring 24 over which is transmitted digital data. A power connector 25 is coupled to a source of power from the system planar wiring 24 so as to provide the PAMM card 11 and associated memory devices 13 and hub chip 15 with electrical power. Each ground connector 23 may be coupled to a ground on the system planar.

Though not illustrated, each connector 17, 23, 25 on the bottom side of PAMM card 11 has a corresponding coupling to a memory hub chip and/or DRAM chip on either the top of bottom side of the PAMM card 11. Each coupling facilitates connection to a pin or other attachment feature of a memory device 13 or a hub chip 15, and hence, facilitates the transfer of power and ground from the connectors 23, 25 to each memory device 13 and signal, power and ground from the connectors 17, 23 and 25 to the hub chip 15. In one embodiment, the power connectors 25 and the ground connectors 23 are alternated to provide isolation, as required, between signal pins 17.

As illustrated, the connectors 17, 23, 25 are preferably arranged in a grid formation comprised of rows and columns with the columns extending in the direction of a centerline l extending along the length of the PAMM card 11. Each column of connectors is separated from adjacent columns of connectors by a column pitch p. Similarly, each row of connectors is separated from each adjacent row of connectors by a row pitch r. Preferably, signal connectors 17, 17' are arranged in pairs to form a multitude of differential wiring pairs 19.

Preferred ranges for column and row pitches p, r are limited by the state of array connection technology and by signal density and mechanical loading requirements. In an embodiment, p and r range from approximately 0.5 mm to 3.0 mm. Such column and row pitches permit the system planar wiring 24 to reside on a single layer of the system planar using lines and spaces (e.g., ~100-micron line width and ~100-micron space width) suitable for high speed signaling and readily obtainable with present circuit-card manufacturing techniques.

DIMM connectors are limited in their construction in that only one line can be placed between pins. This limitation is restrictive to the increasingly desired practice of using differential pair wiring for high-speed signals.

As noted above, signal connectors 17, 17' are preferably arranged into a multitude of differential wiring pairs 19. There are illustrated in exemplary fashion two differential wiring pairs per channel. Since high-speed wiring is usually differential, this is a preferred arrangement. Relaxation of the column and row pitch p, r may be performed to a degree sufficient to reduce or practically eliminate near-end cross talk (NEXT) and far-end cross talk (FEXT) so as to improve IO performance. The power connectors 25 and ground connectors 23 are preferably located along a center line l of the PAMM card 11 to provide optimal power distribution. In addition, low power-plane inductance and minimal electrical crosstalk is achieved when the single ended wiring connections or the differential wiring pairs 19 are inter-digitated with additional power connectors 25 and/or ground connectors 23.

The DRAM packages forming the memory devices 13 on each PAMM-card top view are illustrative only. Such memory devices 13 can be "bare die" attached, or preferably, small-sized packages such as "chip-scale" packages can be utilized. The size of the PAMM card 11 is illustrative only. In practice, a 50 mm×25 mm size PAMM card requires approximately the same amount of space on the system planer as a JEDEC standard 133 mm DIMM on 10 mm centers. In addition, if chip-scale packages are used, the die can be easily pre-tested.

Figure 2B:
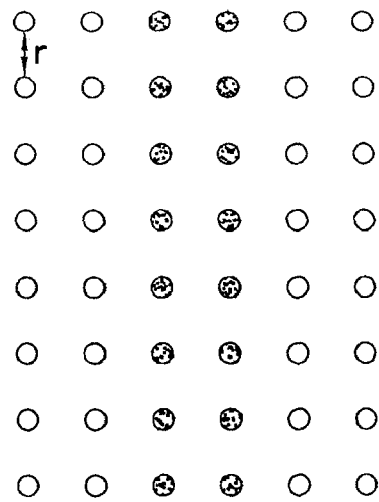
FIG. 2b is a diagram of the connectors of an embodiment of a PAMM.

The particular embodiment shown in FIGS. 1a and 1b and 2 represents one of many possible physical form factors or electrical interfaces which may be employed. If more connectors are desired, they can be added by extending the card length along center line l. Alternatively, connectors can be arranged closer together, either by changing the pitch between columns, rows, or both. Increasing the row pitch r provides increased physical support to the PAMM card 11. As noted above, changing the row pitch r from, for example, 2 mm to 1 mm, allows more rows to be added for higher-capability PAMM (i.e. more pins and thus higher communication bandwidth) without changing the fundamental pitch. That is, a high-speed test head designed to contact a 1 mm pitch PAMM can also contact a 2 mm PAMM. Such an arrangement preserves investment in tester cost, connector development, and the like.

Figure 3A:
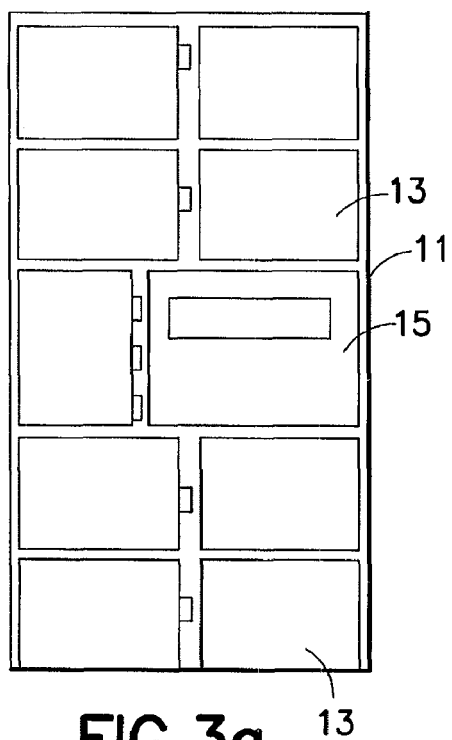
FIG. 3a is an illustration of an embodiment of a top side of the PAMM of the invention.
Figure 3B:
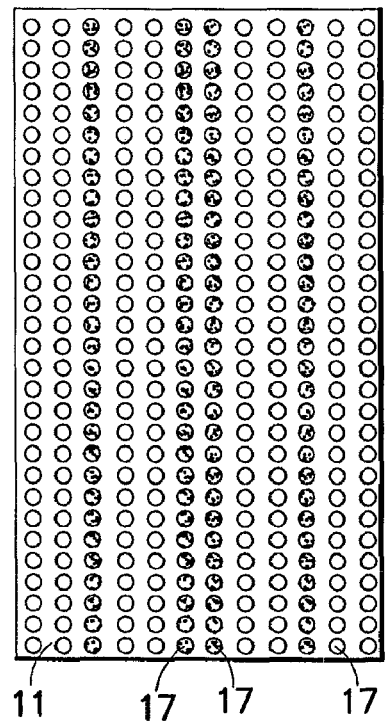
FIG. 3b is an illustration of an embodiment of a bottom side of the PAMM of the invention.
Figure 4:
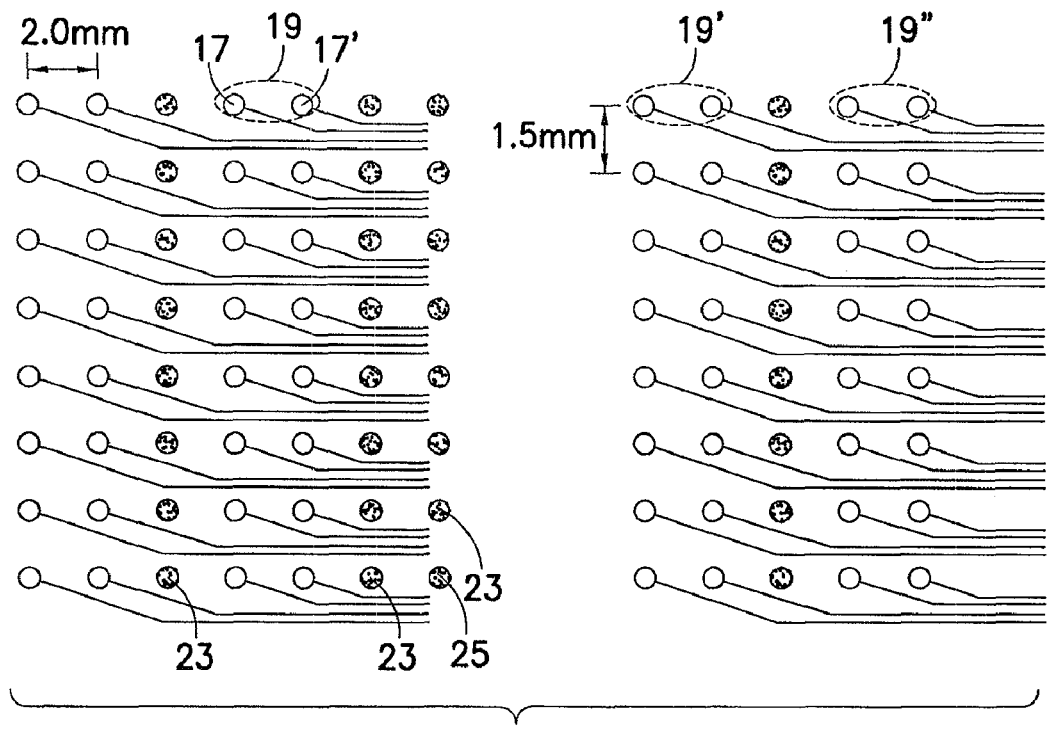
FIG. 4 is a detailed schematic diagram of the wiring for the PAMM of FIG. 3b.
Figure 5B:
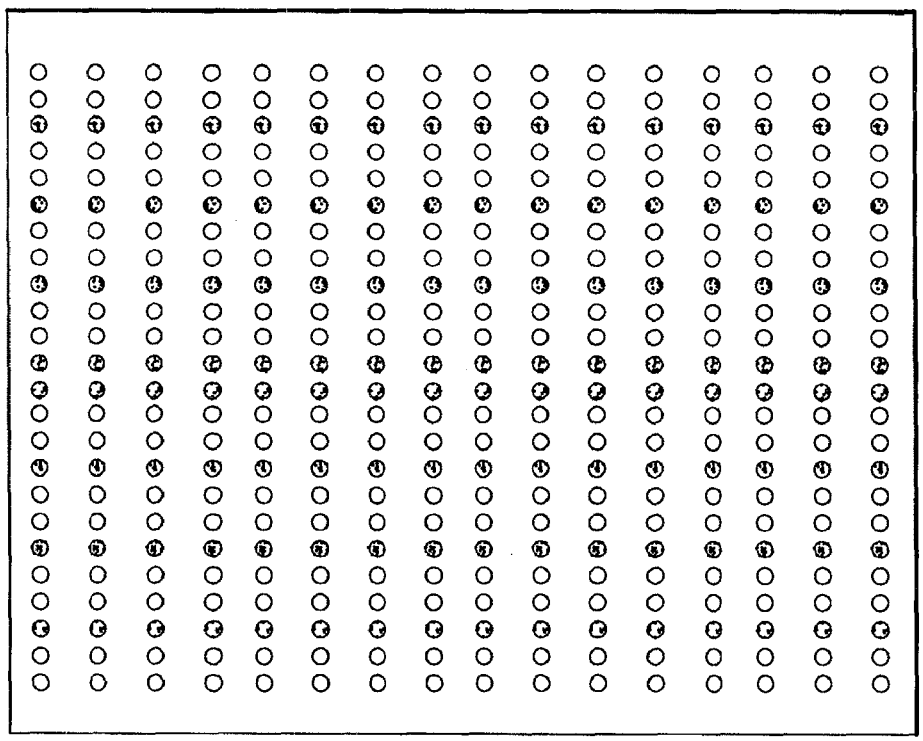
FIG. 5b is an illustration of an embodiment of a bottom side of the PAMM of the invention.
Figure 5A:
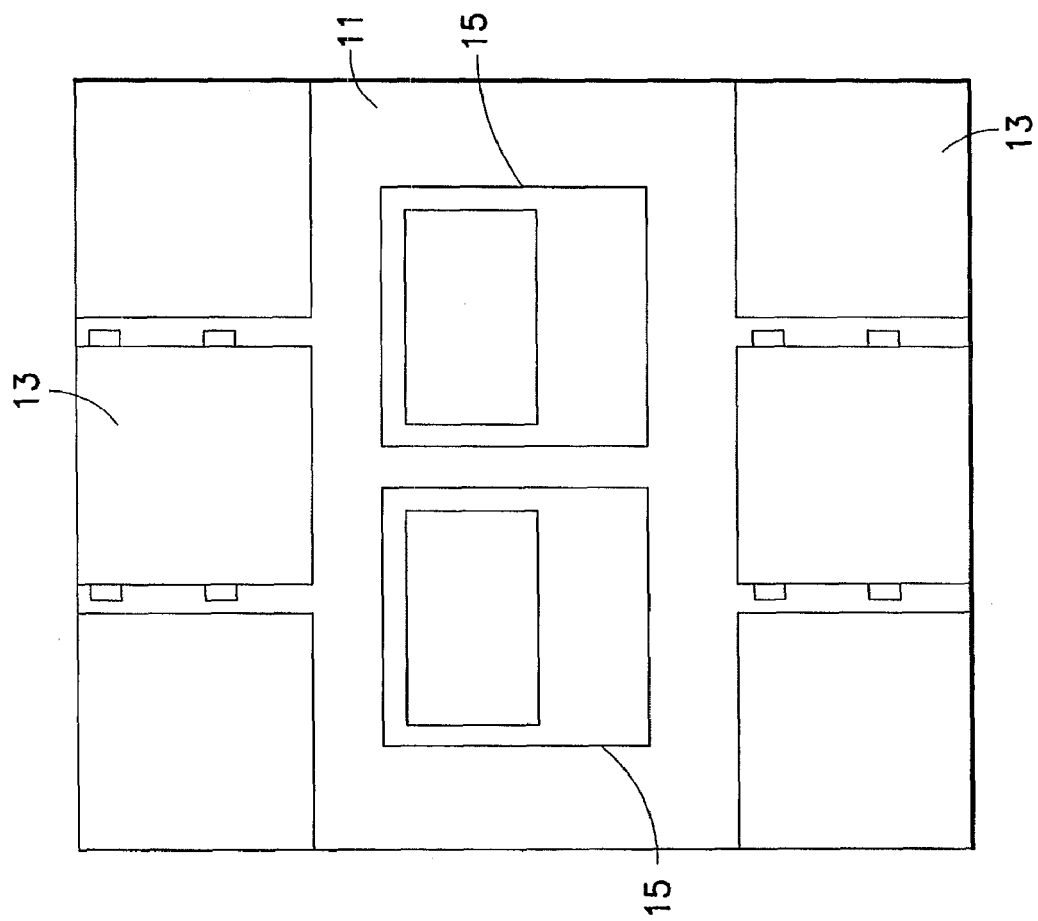
FIG. 5a is an illustration of an embodiment of a top side of the PAMM of the invention.

Examples of alternative embodiments of the PAMM 10 illustrating different connector configurations are shown in FIGS. 3-5. With particular reference to FIG. 5, the PAMM card 11 can be extended as needed to accommodate multiple memory hubs 15 and associated DRAM memory devices 13. In addition, memory devices 13 may be stacked as needed.

Figure 6:
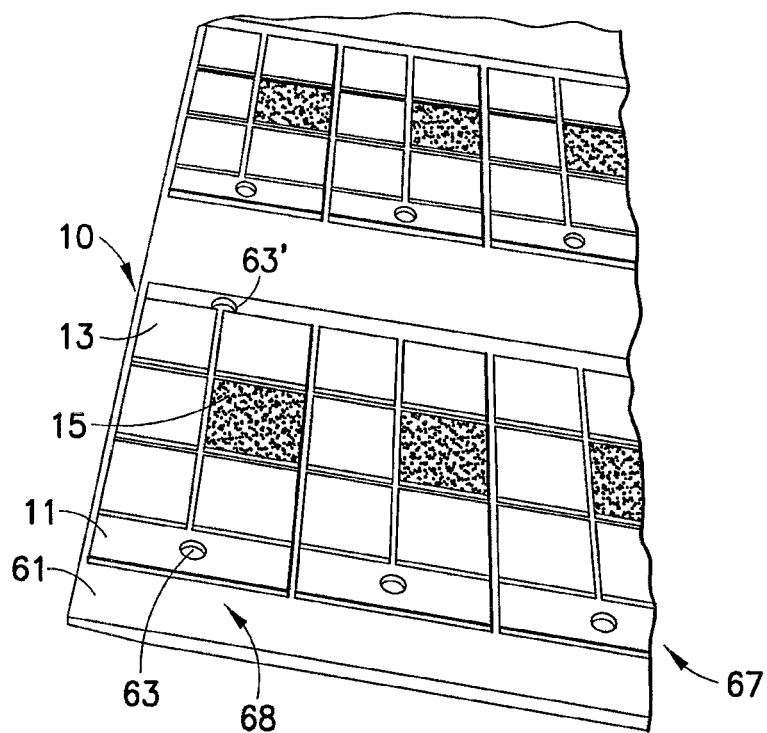
FIG. 6 is a perspective illustration of an embodiment of a PAMM coupled to a system planar.

With reference to FIG. 6, there is illustrated a perspective view of an embodiment of a PAMM 10 coupled to a system planar 61. The system planar may be, but need not be, composed of printed wiring board (PWB) material. Each illustrated PAMM 10 is formed of a single hub chip 15 and five memory devices 13. Again, the number of memory devices illustrated is not limiting as fewer or more devices can be accommodated. One will note the generally planar nature of the PAMM 10 as it extends across an expanse of the system planar 61 so that the major surfaces of the PAMM 10 are generally parallel to those of the system planar 61. The PAMM 10 can be soldered, or otherwise fastened, directly to the system planar 61. Preferably, PAMM 10 is attached, or otherwise coupled, to the system planar 61 via a separable connector array 67 comprising a plurality of connectors 66 (not shown). The position of the separable connector array 67 is indicated in FIG. 6 between the PAMM card 11 and the system planar 61 but is not visible. Preferably, such a separable connector array 67 is formed of a land-grid-array (LGA) interposer, or other grid style connector.

Figure 7:
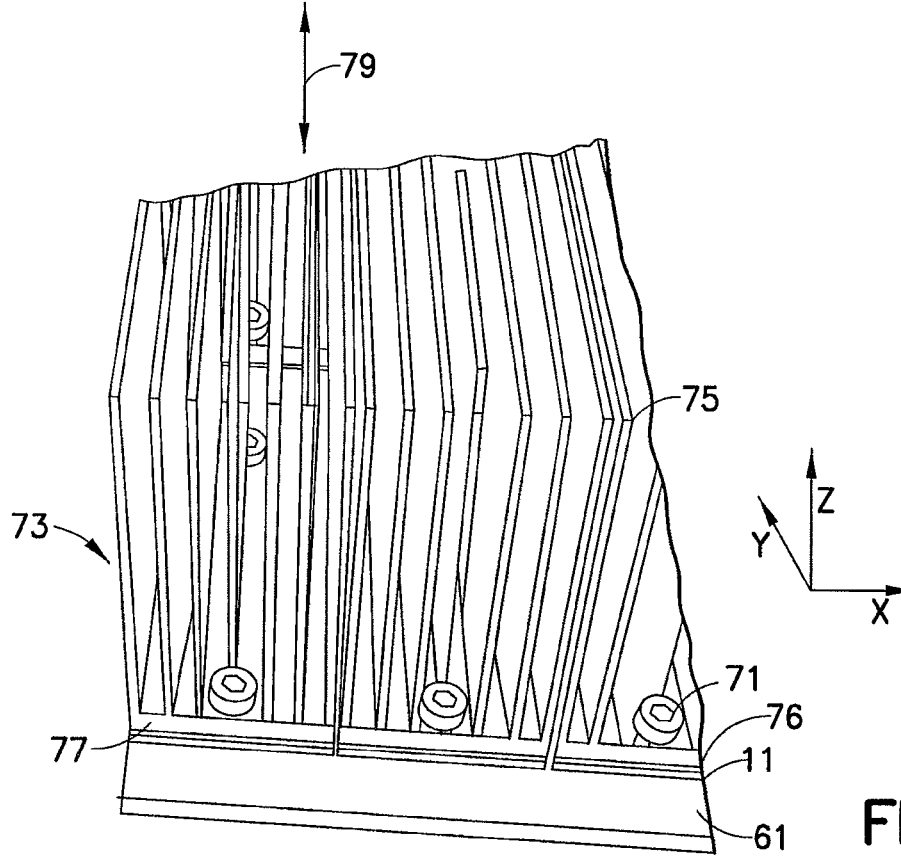
FIG. 7 is a perspective illustration of a heatsink coupled to a PAMM.

Typical LGA interposers require a retention hardware 68 to apply a compressive force between approximately 10 to 100 g per connector 66. In the embodiment illustrated, this force is provided through the provision of PAMM attachment sites 63, 63' located on opposing sides of the PAMM card 11. PAMM attachment sites 63, 63' are locations, preferably near the periphery of PAMM card 11, at which pressure may be applied to couple the PAMM 10 to the system planar in an amount sufficient to meet the per-connector force requirement. In a preferred embodiment, PAMM attachment sites 63, 63' are formed of holes fabricated to receive an attachment device, such as a screw, for attaching the PAMM 10 to the system planar 61. Such screws 71 may include, but are not limited to, M3 screws as shown in FIG. 7. In the embodiment shown, screws 71 operate in concert with attachment sites 63 to form retention hardware 68.

Alternative methods for coupling the PAMM 10 to the system planar 61 include hinge and latch systems and snap-in hold-downs that are engineered to provide both the required alignment of the connectors on the bottom side of the PAMM 10 with associated contacts on the system planar wiring 24, and the retention hardware 68 to apply a compressive force and ensure a reliable connection. The separable connector 67 can be completely separable from the PAMM 10 or system planar 61 and may comprise a series of conduction bumps on a film or an array of metal springs. Alternatively, the connectors on the bottom side of the PAMM card 11 may be coupled to the system planar 61 either by molding conductive contacts directly to either surface, or otherwise affixing spring contacts between the two.

With reference to FIG. 7, there is illustrated a heatsink 73 in combination with the PAMM 10. Heatsink 73 is formed of a base 77 and a plurality of fins 74. The base 77 is perforated by two or more holes 78 through which screws 71 can pass. Heatsink 73 performs two functions. First, because heatsink 73 is coupled to the top surfaces of the memory devices 13 and hub chips 15 through a thin layer 76 of thermal grease, glue, or other thermal-interface material that provides a low conductive thermal resistance, it operates to dissipate heat generated by the memory devices 13 and hub chips 15 by conducting the heat, through its base 77, to the large area of the heat-sink's fins 75, whence the heat is convected away by a stream of air or other fluid flowing through the channels between the fins. Second, referring to the xyz coordinate system on FIG. 7, because the heatsink's fins 75 cause any cross section of the heatsink parallel to the xz plane to have a high area moment of inertia, the heatsink 73 is very resistant to bending along the y axis, and thus very effective at transmitting the binding force of screws 71 across the long y dimension of the PAMM 10, and functions as a key component of the retention hardware 68 thereby insuring that each of the connectors 66 in the connector array 67 receives the required compressive force. Preferably, the conductive thermal resistance between the heatsink base 77 and the heat-producing devices (hub chips 15 and the memory devices 13) should be low. If the components 13, 15 are substantially co-planar, this is accomplished by a planar surface on the underside of the heatsink base 77, because any small gaps between heatsink base 77 and heat-producing devices 13 and 15 can be effectively filled by the thermal-interface layer 76. If however the components 13, are not substantially co-planar, a surface of heatsink base 77 in proximity to the top of PAMM 10 may be fabricated in negative relief corresponding to arrangement of the components 13, 15. As a result, a thin memory device 13 possesses a correspondingly thicker area on the underside of the heatsink base 77. Such a heatsink 73 may be machined, stamped, or cast.

Figure 8:
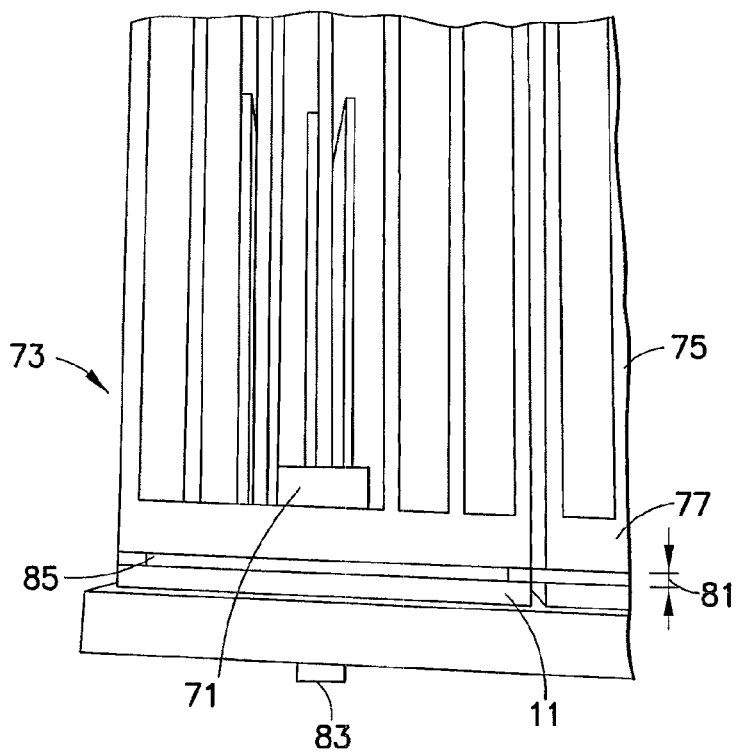
FIG. 8 is a perspective illustration of the means for attaching a heatsink to a PAMM.

With reference to FIG. 8, there is illustrated an embodiment of a PAMM 10 wherein a screw-capturing device 85, such as an E-clip, is placed within a chip thickness space 81 extending from a surface of the heatsink 73 to a surface of the PAMM card 11. Capture device 85 captures screws 71 to heatsink 73 so that screws 71 are not easily lost when heatsink 73 is removed.

With reference to FIG. 9a, there is illustrated, in cross-section, an embodiment of a PAMM card 11. As illustrated, there is not a one to one correspondence between each coupling 91 and a single connector 17, 23, 25. Internal connectors 93 may be arranged so as to couple the couplings 91 to the connectors 17, 23, 25 in any desired configuration. Internal connectors 93 form a part of PAMM card 11 and are constructed of electrically conductive material or wire. Note as well that the DRAMs 13 may be coupled to the hub chip 15 via internal connectors 93 with the hub chip 15 coupled to one or more connectors 17, 23, 25 via internal connectors 93. In addition, DRAMs 13 may be coupled to connectors 17, 23, 25 without coupling to a hub chip 15.

Figure 10:
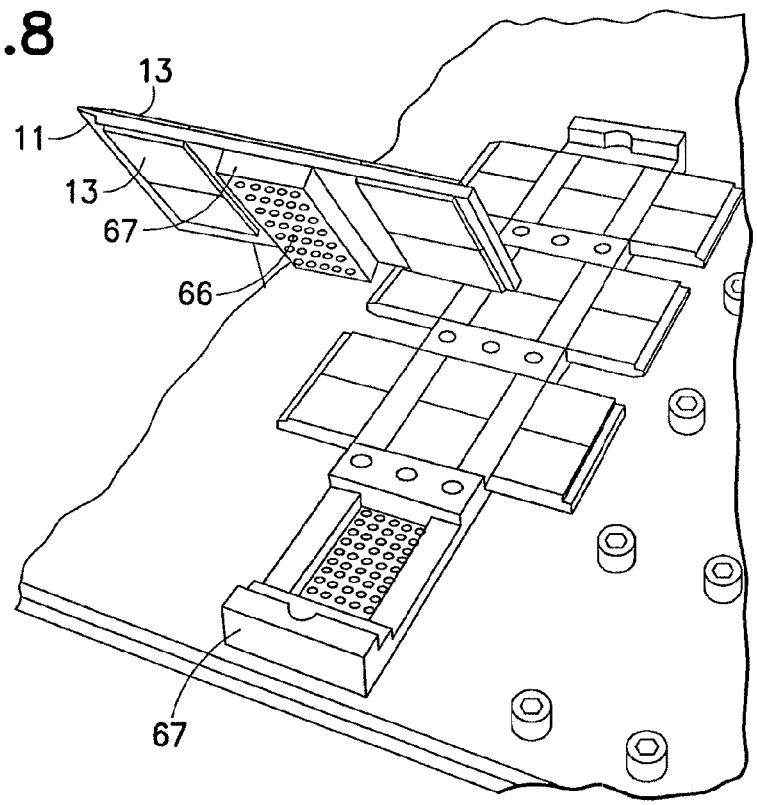
FIG. 10 is a perspective illustration of the PAMM of FIG. 9b.

With reference to FIG. 9b, there is illustrated an embodiment of a PAMM card 11 wherein DRAMs 13 are attached to both sides of PAMM card 11. In such a configuration, connector array 67 serves to provide a separation distance 95 between the DRAMs 13 coupled to the lower side of PAMM card 11 and the system planar 61. With reference to FIG. 10, there is illustrated a perspective view of the PAMM card 11 of FIG. 9b making clear the attachment configuration.

While there has been illustrated and described what is at present considered to be a preferred embodiment of the claimed invention, it will be appreciated that numerous changes and modifications are likely to occur to those skilled in the art. In addition, the various dimensions disclosed above, numbers of chips and the like are all to be viewed as exemplary, and not a limitation upon the use and practice of this invention. For example, the novel constructions shown in the Figures are not limited for use with memory chips and related circuits, but may be used as well with other circuit types. It is intended in the appended claims to cover all those changes and modifications that fall within the spirit and scope of the claimed invention.

What is claimed is:

1. A method of making a circuit assembly comprising:
    providing a generally planar card comprising a first side and a second side, said first side comprising a plurality of couplings and said second side comprising a plurality of connectors configured for connection with system planar wiring;
    coupling a plurality of memory devices to said card via a first portion of said plurality of couplings;
    coupling at least one hub chip to said card via a second portion of said plurality of couplings;
    wherein individual ones of said plurality of couplings are connected to other ones of said plurality of couplings and to other ones of said plurality of connectors via a plurality of internal connectors,
    wherein said plurality of connectors is arranged in a grid formed of a plurality of connector rows and connector columns, and
    wherein a column of power connectors and a column of ground connectors are located along a center line of the grid.

2. The method of claim 1 further comprising attaching said card to a system planar such that at least one of said plurality of connectors is coupled to a corresponding wire in a system planar wiring.

3. The method of claim 1 further comprising the additional step of interposing a separable connector between said card and said system planar for coupling said plurality of connectors to said system planar wiring.

4. The method of claim 3 wherein said separable connector comprises a LGA interposer.

5. The method of claim 1 further comprising providing a heatsink having a heatsink base comprising a surface extending across said first side of said card.

6. The method of claim 5 wherein said heatsink comprises a plurality of heat sink fins.

7. The method of claim 6 wherein said heatsink fins are generally aligned with an airflow direction when the memory module is connected to a system planar.

8. The method of claim 2 wherein said card is attached to said system planar through the use of an attachment device comprising at least one of pins, hinge and latch systems, and snap-in hold-downs.

9. The method of claim 1 wherein each of said plurality of connectors is comprising at least one of power connectors, ground connectors, and signal connectors.

10. The method of claim 1 wherein at least one of said plurality of memory devices comprises a dynamic random access memory (DRAM) device.

11. The method of claim 1 wherein each of said plurality of connector rows is separated by a row pitch and each of said plurality of connector columns is separated by a column pitch and wherein said row pitch and said column pitch are between approximately 0.5 mm and 3.0 mm.

12. The method of claim 9 wherein said plurality of signal connectors is arranged to form a plurality of differential signal pairs.

13. The method of claim 12 wherein each of said plurality of differential wiring pairs is inter-digitated with a non-signal connector.

14. The method of claim 1 wherein said at least one connector is a pingrid array.

15. The method of claim 1 wherein said second side of said generally planar card comprises a second plurality of couplings, and
    further comprising coupling at least one memory device to said card via the second plurality of couplings.

16. The method of claim 1 further comprising providing a thermal-interface material layer to top surfaces of the plurality of memory devices and a top surface of the at least one hub chip.

17. The method of claim 16 further comprising coupling a heatsink to the top surfaces of the plurality of memory devices and the top surface of the at least one hub chip via the thermal-interface material layer.

18. The method of claim 9 wherein said plurality of signal connectors is arranged to form a plurality of single-ended signal connections.

19. The method of claim 1 further comprising coupling a separable connector for mating at least one of said plurality of connectors to a system planar wiring.

* * * * *